(12) United States Patent
Kuwabara et al.

(10) Patent No.: US 11,705,346 B2
(45) Date of Patent: Jul. 18, 2023

(54) SUBSTRATE PROCESSING APPARATUS

(71) Applicant: Tokyo Electron Limited, Tokyo (JP)

(72) Inventors: Yusei Kuwabara, Miyagi (JP); Takahiro Senda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 161 days.

(21) Appl. No.: 17/223,141

(22) Filed: Apr. 6, 2021

(65) Prior Publication Data
US 2021/0313201 A1 Oct. 7, 2021

(30) Foreign Application Priority Data
Apr. 7, 2020 (JP) ................. 2020-069209

(51) Int. Cl.
*H01L 21/67* (2006.01)
*H01J 37/32* (2006.01)

(52) U.S. Cl.
CPC .. *H01L 21/67069* (2013.01); *H01J 37/32513* (2013.01); *H01J 37/32715* (2013.01); *H01J 37/32816* (2013.01); *H01L 21/67103* (2013.01); *H01J 37/32431* (2013.01); *H01J 2237/334* (2013.01)

(58) Field of Classification Search
CPC .......... H01L 21/67069; H01L 21/67103; H01J 37/32513; F16B 31/02; F16B 31/04; F16B 5/0241; F16B 2001/0078; Y10T 403/21; Y10T 403/213; Y10T 403/217; F15B 2211/7055; F15B 2211/31576; F15B 15/224; F15B 15/227; F15B 15/1461; F15B 15/17
See application file for complete search history.

(56) References Cited

U.S. PATENT DOCUMENTS

2008/0087641 A1* 4/2008 De La Llera ..... H01J 37/32449
438/689
2009/0165722 A1* 7/2009 Ha .................... H01J 37/32091
118/728

(Continued)

FOREIGN PATENT DOCUMENTS

| JP | H11-111626 A | 4/1999 | |
|---|---|---|---|
| KR | 2010-0107389 A | * 10/2010 | ............ H01J 37/321 |
| KR | 1979222 B1 | * 5/2019 | .......... H01J 37/3211 |

*Primary Examiner* — Keath T Chen
*Assistant Examiner* — Margaret Klunk
(74) *Attorney, Agent, or Firm* — Pearne & Gordon LLP

(57) ABSTRACT

An upper member is disposed at an upper portion within a processing chamber. A ceiling member forms a ceiling of the processing chamber, and is provided with a through hole at a facing surface thereof which faces the upper member. A supporting member supports the upper member with a first end thereof located inside the processing chamber by being inserted through the through hole and slid within the through hole. An accommodation member accommodates therein a second end of the supporting member located outside the processing chamber, and is partitioned into a first space at a first end side and a second space at a second end side in a moving direction with respect to the second end. A pressure controller generates a pressure difference between the first space and the second space. The pressure difference allows the supporting member to be moved.

12 Claims, 7 Drawing Sheets

(56) References Cited

U.S. PATENT DOCUMENTS

2015/0357165 A1* 12/2015 Takahashi ......... H01J 37/32862
                                                     134/1.1
2017/0365443 A1* 12/2017 Carducci ............. H01J 37/3255
2018/0156247 A1*  6/2018 Revenus ............... F15B 15/149

* cited by examiner

SUBSTRATE PROCESSING APPARATUS

CROSS-REFERENCE TO RELATED APPLICATION

This application claims the benefit of Japanese Patent Application No. 2020-069209 filed on Apr. 7, 2020, the entire disclosure of which is incorporated herein by reference.

TECHNICAL FIELD

The various aspects and embodiments described herein pertain generally to a substrate processing apparatus.

BACKGROUND

Patent Document 1 describes a structure in which a shower plate is placed to close a recess-shaped opening provided at a bottom surface of a shower head main body, and the shower plate is fastened to the shower head main body with bolts.

Patent Document 1: Japanese Patent Laid-open Publication No. H11-111626

SUMMARY

In one exemplary embodiment, a substrate processing apparatus includes an upper member, a ceiling member, a supporting member, an accommodation member and a pressure controller. The upper member is disposed at an upper portion within a processing chamber in which a substrate processing upon a substrate is performed. The ceiling member forms a ceiling of the processing chamber, and is provided with a through hole at a facing surface thereof which faces the upper member. The supporting member is configured to support the upper member with a first end thereof which is located inside the processing chamber by being inserted through the through hole and slid within the through hole. The accommodation member accommodates therein a second end of the supporting member located outside the processing chamber, and is partitioned into a first space at a first end side in a moving direction of the supporting member with respect to the second end of the supporting member and a second space at a second end side in the moving direction with respect to the second end. The pressure controller is configured to generate a pressure difference between the first space and the second space. The pressure difference allows the supporting member to be moved.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
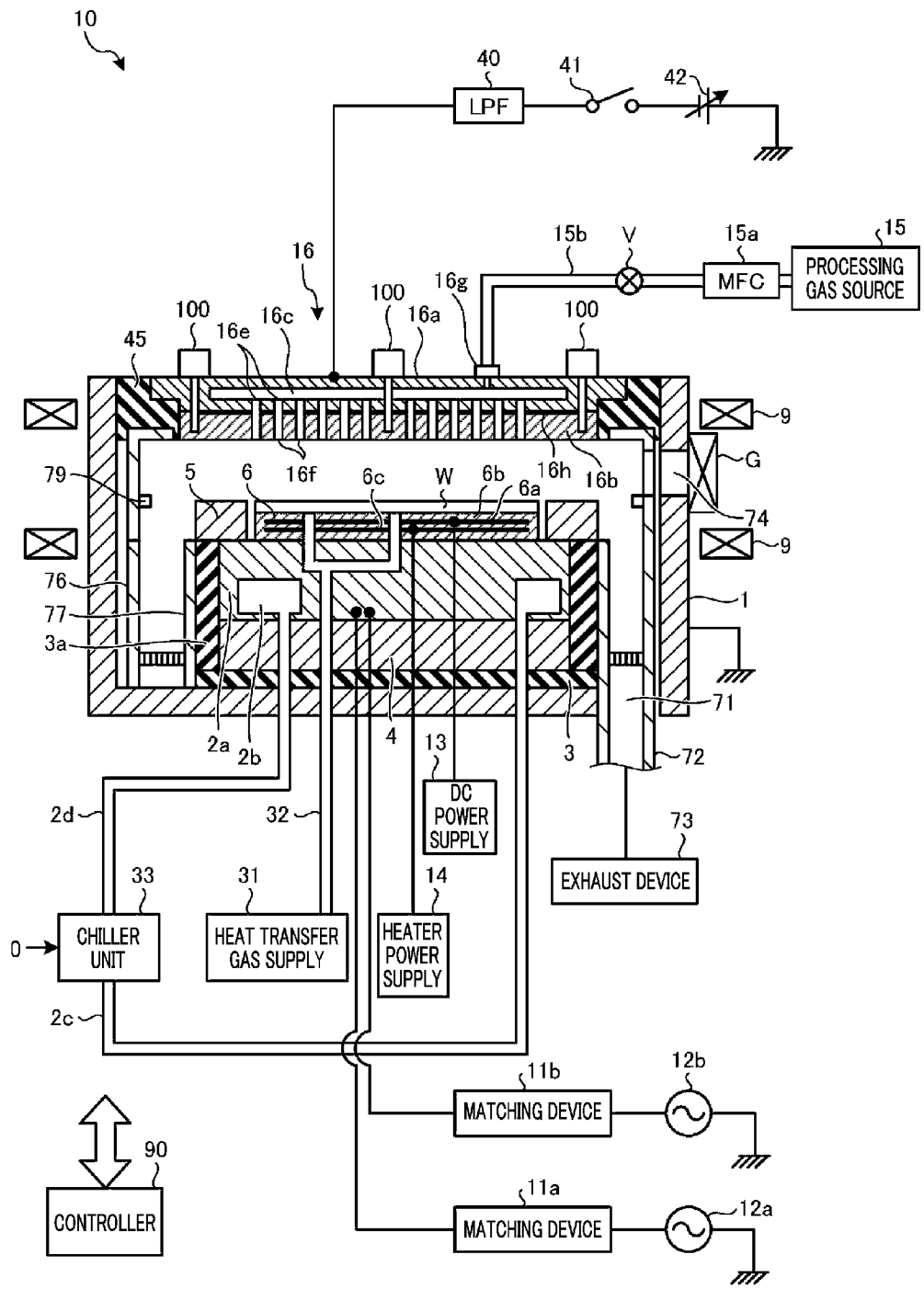
FIG. 1 is a schematic cross sectional view illustrating an example configuration of a substrate processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, an exemplary embodiment of a substrate processing apparatus according to the present disclosure will be described in detail with reference to the accompanying drawings. Further, it should be noted that the substrate processing apparatus of the present disclosure is not limited by the present exemplary embodiment.

In the substrate processing apparatus configured to perform a plasma processing, plasma is formed in a processing chamber by applying a high frequency power while supplying a processing gas from a shower head which is disposed at a ceiling of the processing chamber. The shower head receives heat from the plasma. Accordingly, in a structure in which a ceiling member such as a shower head main body and an upper member such as a shower plate are joined with a bolt, as in Patent Document 1, for example, a contact pressure between the ceiling member and the upper member is changed due to a linear expansion difference of the bolt caused by the heat from the plasma. By way of example, if a sufficient contact pressure is not obtained as the bolt is linearly expanded, heat transfer property is deteriorated and a temperature of the upper member is increased. As a result, the upper member may be distorted or bent, and even broken due to concentration of a stress. In view of this, there is a demand for a technique capable of suppressing the change of the contact pressure between the ceiling member and the upper member.

[Configuration of Substrate Processing Apparatus]

Now, the substrate processing apparatus according to the exemplary embodiment will be explained. The following description will be provided for an example where the substrate processing apparatus according to the exemplary embodiment is a plasma processing apparatus and an etching processing using plasma is performed as a substrate processing. FIG. 1 is a schematic cross sectional view illustrating an example configuration of a substrate processing apparatus 10 according to the exemplary embodiment. The substrate processing apparatus 10 according to the present exemplary embodiment is configured to perform, on a substrate such as a semiconductor wafer, an etching processing using plasma.

The substrate processing apparatus 10 has a hermetically sealed chamber 1. The chamber 1 is made of, by way of example, aluminum a surface of which is covered with an anodically oxidized film, and has a substantially cylindrical shape. The chamber 1 is grounded. The substrate processing upon the substrate is performed within the chamber 1. That is, the chamber 1 serves as a processing chamber in which the substrate processing is performed.

A base 2a made of a conductive metal such as, but not limited to, aluminum is provided within the chamber 1. The base 2a serves as a lower electrode. The base 2a is supported by a conductive supporting table 4 which is provided on an insulating plate 3. Further, an edge ring 5 made of, by way of non-limiting example, single crystalline silicon is provided on a periphery of the base 2a. The edge ring 5 may also be called a focus ring. A cylindrical inner wall member 3a made of, for example, quartz is provided on side surfaces of the base 2a and the supporting table 4, surrounding the base 2a and the supporting table 4.

A shower head 16 serving as an upper electrode is disposed above the base 2a to face the base 2a substantially in parallel, that is, to face the substrate W placed on the base 2a. The shower head 16 and the base 2a serve as a pair of electrodes (the upper electrode and the lower electrode respectively). The base 2a is connected with a high frequency power supply 12a via a matching device 11a. Further, the base 2a is also connected with a high frequency power supply 12b via a matching device 11b.

The high frequency power supply 12a is configured to supply a high frequency power having a preset frequency (for example, 100 MHz) for plasma formation to the base 2a. Further, the high frequency power 12b is configured to supply a high frequency power for ion attraction (bias) having a frequency (for example, 13 MHz) lower than the frequency of the high frequency power supply 12a to the base 2a.

An electrostatic chuck 6 configured to attract and hold the substrate W and heat the substrate W is disposed on a top surface of the base 2a. The electrostatic chuck 6 includes an insulator 6b, an electrode 6a embedded in the insulator 6b, and a heater 6c. The electrode 6a is connected to a DC power supply 13. The heater 6c is connected to a heater power supply 14. The electrostatic chuck 6 generates a Coulomb force in a surface of the electrostatic chuck 6 by a DC voltage applied from the DC power supply 13, and attracts and holds the substrate W on a top surface thereof by the Coulomb force. An on/off operation of the DC power supply 13 is controlled by a controller 90 to be described later.

Further, the electrostatic chuck 6 heats the substrate W by the heater 6c which is heated by a power supplied from the heater power supply 14. A plurality of protrusions is formed on the top surface of the electrostatic chuck 6, and the substrate W is supported by these protrusions. A heat transfer gas to be described later is supplied between the protrusions.

A path 2b through which a heat transfer medium flows is formed within the base 2a, and the path 2b is connected with a chiller unit 33 configured to control a temperature of the heat transfer medium via pipelines 2c and 2d. As the heat transfer medium supplied from the chiller unit 33 is circulated within the path 2b, a temperature of the base 2a is controlled by heat exchange between the base 2a and the heat transfer medium.

Further, the base 2a is provided with a pipeline 32 through which a heat transfer gas (backside gas) such as a helium gas is supplied into a gap between the electrostatic chuck 6 and the substrate W. The pipeline 32 is connected to a heat transfer gas supply 31. The heat transfer gas supply 31 is configured to supply the heat transfer gas into the gap between the electrostatic chuck 6 and the substrate W through the pipeline 32.

As the temperature of the heat transfer medium flowing in the path 2b, the power supplied to the heater 6c within the electrostatic chuck 6 and a pressure of the heat transfer gas supplied into the gap between the electrostatic chuck 6 and the substrate W are controlled, a temperature of the substrate W on the electrostatic chuck 6 is controlled to fall within a predetermined temperature range.

The shower head 16 is provided at an upper portion of the chamber 1. The shower head 16 includes a main body 16a and an upper ceiling plate 16b. The main body 16a forms a ceiling of the chamber 1. The main body 16a is supported at an upper portion of the chamber 1 with an insulator member 45 therebetween. The main body 16a is formed of, for example, aluminum having an anodically oxidized surface. The upper ceiling plate 16b is made of a silicon-containing material such as, but not limited to, quartz. The upper ceiling plate 16b is disposed at the upper portion within the chamber 1. The main body 16a is provided with supports 100 configured to support the upper ceiling plate 16b. The supports 100 are provided on a top surface of the main body 16a at positions corresponding to a center and a periphery of the upper ceiling plate 16b, and each support 100 penetrates the main body 16a to support the upper ceiling plate 16b.

Figure 2:
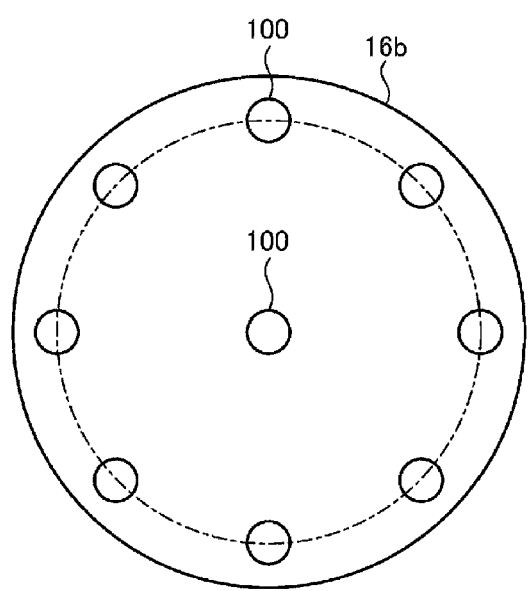
FIG. 2 is a diagram illustrating an example of a layout of supports according to the exemplary embodiment.

FIG. 2 is a diagram illustrating a layout of the supports 100 according to the exemplary embodiment. FIG. 2 illustrates the shower head 16 seen from above it, and shows the positions where the supports 100 are arranged. The upper ceiling plate 16b has a disk shape. One support 100 is provided at a position corresponding to the center of the upper ceiling plate 16b. Further, eight supports 100 are provided at positions corresponding to an inside of an edge of the upper ceiling plate 16b, and arranged at a regular distance along the edge of the upper ceiling plate 16b. Further, the arrangement positions of the supports 100 shown in FIG. 2 are just an example and not limiting. By way of example, all the supports 100 may be provided along the edge of the upper ceiling plate 16b without placing one of them at the center of the upper ceiling plate 16b. Further, the number of the supports 100 is not particularly limited as long as more than two supports 100 are equi-spaced along the edge of the upper ceiling plate 16b. Desirably, six to eight supports 100 are provided.

Referring back to FIG. 1, a functional film 16h is provided between the main body 16a and the upper ceiling plate 16b. The functional film 16h has a size substantially equal to or slightly smaller than a size of the upper ceiling plate 16b. The functional film 16h is provided for electric conduction (electric conduction/insulation) and thermal conduction (thermal conduction/insulation) between the main body 16a and the upper ceiling plate 16b. For example, the functional film 16h has thermal conductivity and electric conductivity to maintain thermal conductivity and electric conductivity between the main body 16a and the upper ceiling plate 16b.

Further, the functional film 16h also serves as a buffer member between the main body 16a and the upper ceiling plate 16b.

A diffusion space 16c is formed within the main body 16a. A multiple number of gas outlet openings 16e is formed in a bottom portion of the main body 16a to be located under the diffusion space 16c. A multiple number of gas discharge openings 16f is formed through the upper ceiling plate 16b in a thickness direction thereof, and these gas discharge openings 16f respectively communicate with the gas outlet openings 16e. In this configuration, a processing gas supplied into the diffusion space 16c is diffused within the diffusion space 16c and supplied into the chamber 1 in a shower shape through the gas outlet openings 16e and the gas discharge openings 16f. Further, the main body 16a or the like is equipped with a temperature adjuster such as a non-illustrated heater and a non-illustrated pipeline for circulating the heat transfer medium. Thus, the shower head 16 can be adjusted to a temperature within a required temperature range during the processing of the substrate W.

A gas inlet opening 16g for introducing the processing gas into the diffusion space 16c is formed at the main body 16a. The gas inlet opening 16g is connected with a processing gas source 15 configured to supply, via a pipeline 15b, the processing gas for the processing of the substrate W. The pipeline 15b is equipped with a valve V and a mass flow controller (MFC) 15a. The processing gas supplied from the processing gas source 15 is introduced into the diffusion space 16c of the shower head 16 via the pipeline 15b, and then supplied into the chamber 1 through the gas outlet openings 16e and the gas discharge openings 16f.

The shower head 16 is electrically connected with a variable DC power supply 42 via a low pass filter (LPF) 40 and a switch 41. The switch 41 controls a supply and a stop of the supply of a DC voltage to the shower head 16 from the variable DC power supply 42. For example, when the high frequency powers are supplied to the base 2a from the high frequency power supplies 12a and 12b to form the plasma within the chamber 1, the switch 41 is turned on when necessary, so that a DC voltage having a preset magnitude is applied to the shower head 16.

An exhaust port 71 is formed at a bottom of the chamber 1. An exhaust device 73 is connected to the exhaust port 71 via a pipeline 72. The exhaust device 73 includes a vacuum pump, and is capable of decompressing the chamber 1 to a preset vacuum level by operating the vacuum pump. Further, an opening 74 through which the substrate W is carried in or out is formed at a sidewall of the chamber 1, and a gate valve G configured to open or close the opening 74 is provided at the opening 74.

On an inner wall of the chamber 1, a deposition shield 76 is provided along an inner wall surface of the chamber 1 in a detachable manner. Further, a deposition shield 77 is disposed on an outer side surface of the inner wall member 3a to cover the inner wall member 3a. The deposition shields 76 and 77 are configured to suppress an etching byproduct (deposit) from adhering to the inner wall of the chamber 1. Further, a conductive member (GND block) 79, which is DC-connected to the ground, is provided at a position of the deposition shield 76 which is substantially on a level with the substrate W attracted to and held on the electrostatic chuck 6. The conductive member 79 is configured to suppress an abnormal discharge within the chamber 1.

Further, ring magnets 9 are concentrically disposed around the chamber 1. The ring magnets 9 form a magnetic field in a space between the shower head 16 and the base 2a. The ring magnets 9 are configured to be rotated by a non-illustrated rotating device.

The substrate processing apparatus 10 is equipped with the controller 90. The controller 90 is implemented by, for example, a computer having a processor, a storage, an input device, a display device, and so forth. The controller 90 controls the individual components of the substrate processing apparatus 10. In the controller 90, an operator can input commands through the use of the input device to manage the substrate processing apparatus 10. Further, in the controller 90, an operational status of the substrate processing apparatus 10 can be visually displayed on the display device. Further, the storage of the controller 90 stores therein control programs for controlling various processings performed in the substrate processing apparatus 10 by the processor and recipe data. As the processor of the controller 90 controls the individual components of the plasma processing apparatus 10 according to the recipe data by executing the control programs, a required processing is performed in the substrate processing apparatus 10. By way of example, the controller 90 controls the individual components of the substrate processing apparatus 10 to perform an etching processing on a substrate carried into the substrate processing apparatus 10.

[Configuration of Support]

Figure 3:
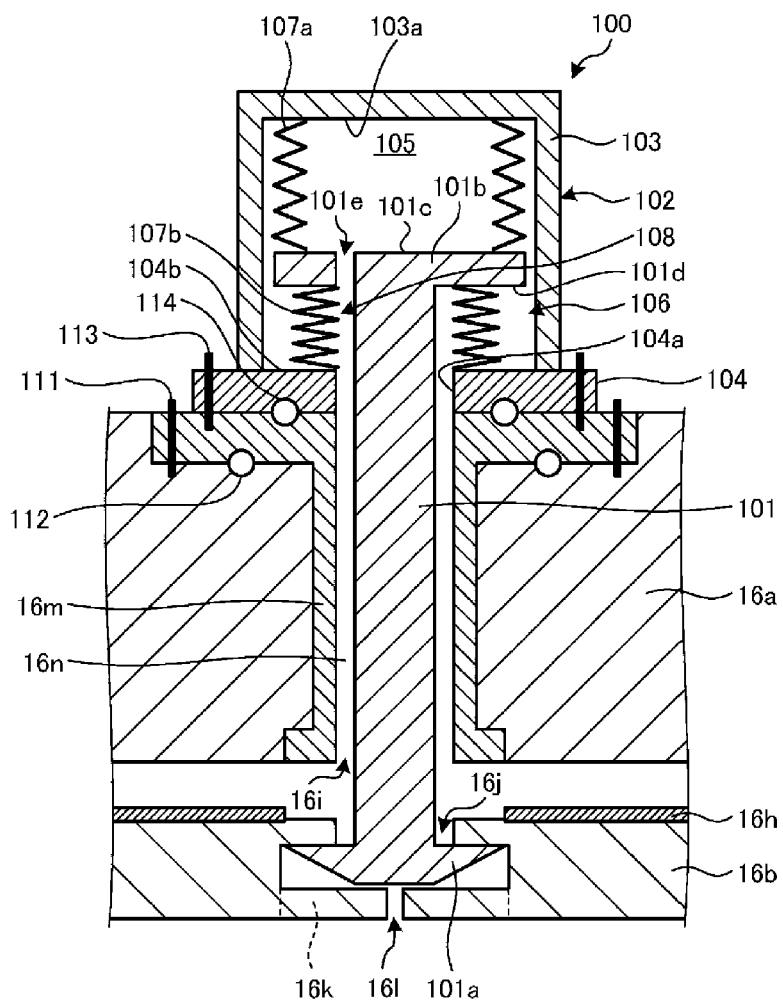
FIG. 3 is a diagram illustrating a configuration of the support according to the exemplary embodiment.

FIG. 3 is a diagram illustrating a configuration of the support 100 according to the exemplary embodiment. FIG. 3 presents a cross sectional view illustrating an internal configuration of the single support 100. The main body 16a has a through hole 16i formed to correspond to a position where the upper ceiling plate 16b is supported. The support 100 is provided on the top surface of the main body 16a, corresponding to the position of the through hole 16i.

The support 100 has a supporting member 101 and an accommodation member 102.

The supporting member 101 is formed to have a circular column shape and inserted in the through hole 16i. The supporting member 101 is inserted through the through hole 16i and configured to be slidable therein. The supporting member 101 supports the upper ceiling plate 16b with one end portion 101a thereof which is located inside the chamber 1. By way of example, the upper ceiling plate 16b and the functional film 16h have a hole 16j formed at a position corresponding to the supporting member 101. The hole 16j is formed such that a diameter of the hole 16j at a lower side of the upper ceiling plate 16b is larger than a diameter of the hole 16j at an upper side of the upper ceiling plate 16b. The end portion 101a of the supporting member 101 is inserted into the hole 16j of the upper ceiling plate 16b. The end portion 101a is formed to have a disk shape having a diameter larger than the diameter of the hole 16j at the upper side of the upper ceiling plate 16b. As the end portion 101a is caught in the upper ceiling plate 16b, the supporting member 101 supports the upper ceiling plate 16b. A portion of a lower surface of the upper ceiling plate 16b corresponding to the hole 16j, which is exposed to the plasma, is covered with a cover member 16k which is made of the same material as the upper ceiling plate 16b. The cover member 16k is provided with a small hole 16l.

An insulating member 16m made of an insulating material is provided along a circumferential surface of the through hole 16i with a gap from the supporting member 101. The insulating member 16m has a cylindrical shape having a hole formed along a central axis thereof, and the supporting member 101 is inserted through this hole. Outer diameters of an upper end and a lower end of the insulating member 16m are set to be larger than the diameter of the through hole 16i.

The supporting member 101 is made of a conductive material. The supporting member 101 is insulated from the main body 16a by the insulating member 16m.

The insulating member 16m is fixed to the main body 16a by a fixing member 111 such as a bolt. Further, the insulating member 16m has a sealing member 112 such as a seal at a contact surface in contact with the main body 16a. The sealing member 112 surrounds the supporting member 101 and hermetically seals it.

The accommodation member 102 has a housing 103 and a cover 104.

The housing 103 is formed to have a cylindrical shape with one end at an upper side thereof closed, and the other end at a lower side thereof is closed by the cover 104.

The cover 104 is fixed to the insulating member 16m by a fixing member 113 such as a bolt. Further, the cover 104 has a sealing member 114 such as a seal at a contact surface in contact with the insulating member 16m. The sealing member 114 surrounds the supporting member 101 and hermetically seals it.

The accommodation member 102 accommodates therein the other end portion 101b of the supporting member 101 which is located outside the chamber 1. By way of example, in the accommodation member 102, a hole 104a slightly larger than the supporting member 101 is formed at the cover 104. The supporting member 101 is inserted through the hole 104a, and the end portion 101b is located within the accommodation member 102.

In the accommodation member 102, a first space 105 and a second space 106 are provided while being separated from each other. The first space 105 is provided at an upper side as one end side in a moving direction of the supporting member 101 with respect to the end portion 101b, and the second space 106 is provided at a lower side as the other end side in the moving direction of the supporting member 101 with respect to the end portion 101b. By way of example, the end portion 101b of the supporting member 101 is formed to have a disk shape having a diameter larger than a diameter of the hole 104a and substantially equal to an inner diameter of the accommodation member 102. A bellows 107a is provided on a top surface 101c of the end portion 101b along a periphery thereof. The bellows 107a is connected to the top surface 101c of the end portion 101b and an inner top surface 103a of the housing 103. The inside of the accommodation member 102 is partitioned into the first space 105 and the second space 106 by the bellows 107a. The bellows 107a is configured to be expansible/contractible in the moving direction of the supporting member 101, and hermetically seals the first space 105 surrounded by the bellows 107a while allowing the first space 105 to be separated from the second space 106.

Further, in the accommodation member 102, the second space 106 and a third space 108 are provided around the supporting member 101 while being separated from each other. In the accommodation member 102, a bellows 107b is provided around the supporting member 101. The bellows 107b is connected to a bottom surface 101d of the end portion 101b and a top surface 104b of the cover 104. The bellows 107b is configured to be expansible/contractible in the moving direction of the supporting member 101, and hermetically seals the third space 108 which is provided around the supporting member 101 and surrounded by the bellows 107b, while allowing the third space 108 to be separated from the second space 106.

The end portion 101b is provided with a hole 101e through which the first space 105 and the third space 108 are connected. In the through hole 16i, a slight gap 16n is formed between the insulating member 16m and the supporting member 101 to allow the supporting member 101 to be slid smoothly.

With this configuration, the first space 105 communicates with the inside of the chamber 1 through the hole 101e, the third space 108 and the gap 16n, the hole 16j and the hole 16l. The second space 106 is configured as an atmospheric pressure space. Since the first space 105 and the third space 108 communicate with the inside of the chamber 1, pressures of these spaces 105 and 108 are set to be equal to an internal pressure of the chamber 1.

Now, there will be explained an operation of the substrate processing apparatus 10 according to the exemplary embodiment when the substrate processing apparatus 10 performs the etching processing using plasma.

Figure 4:
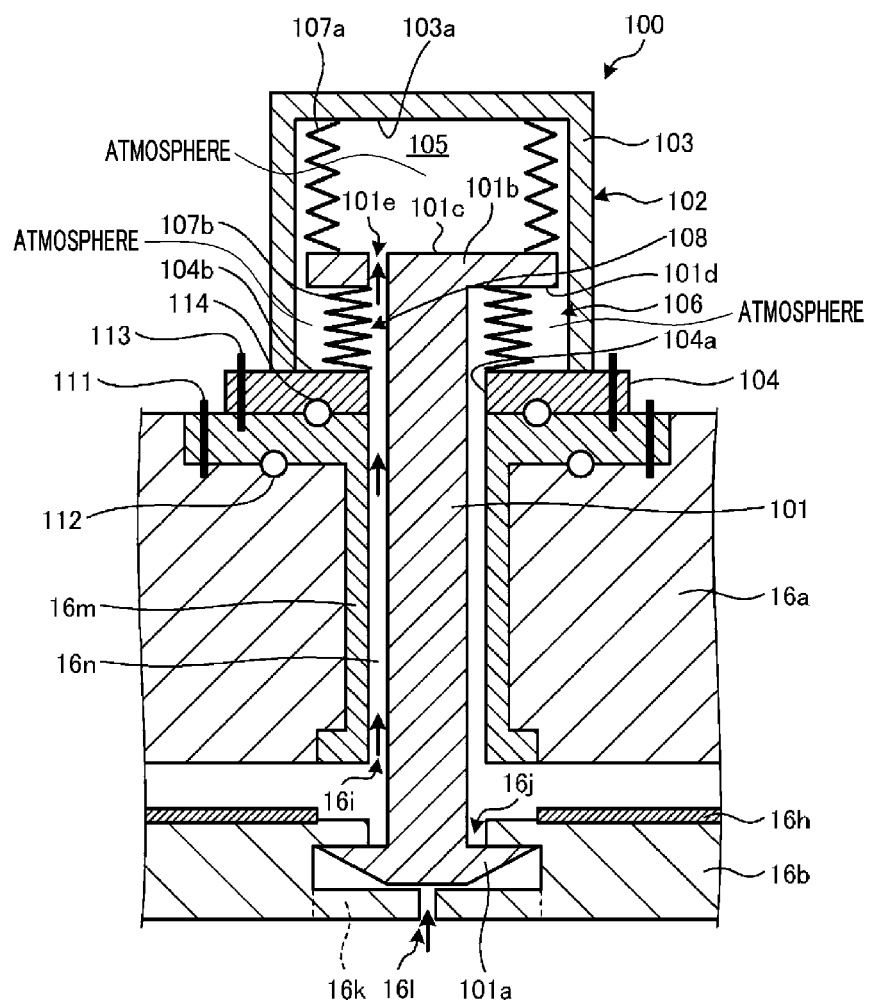
FIG. 4 is a diagram illustrating an operation of the support before decompression.

When the inside of the chamber 1 is in an atmospheric state, the first space 105, the second space 106 and the third space 108 of the support 100 are under an atmospheric pressure. FIG. 4 is a diagram illustrating an operation of the support 100 before decompression. In the support 100, the second space 106 is set to have the atmospheric pressure. Further, when the inside of the chamber 1 is in the atmospheric state, the atmosphere is introduced from the chamber 1 into the support 100, so that the first space 105 and the third space 108 are turned into the atmospheric pressure. When the first space 105 and the second space 106 are under the atmospheric pressure, the supporting member 101 is lowered, and the upper ceiling plate 16b and the main body 16a are spaced apart from each other.

When the substrate processing apparatus 10 performs the etching processing, the inside of the chamber 1 is decompressed to a preset vacuum level by the exhaust device 73. If the inside of the chamber 1 is decompressed by the exhaust device 73, the first space 105 and the third space 108 are decompressed.

Figure 5:
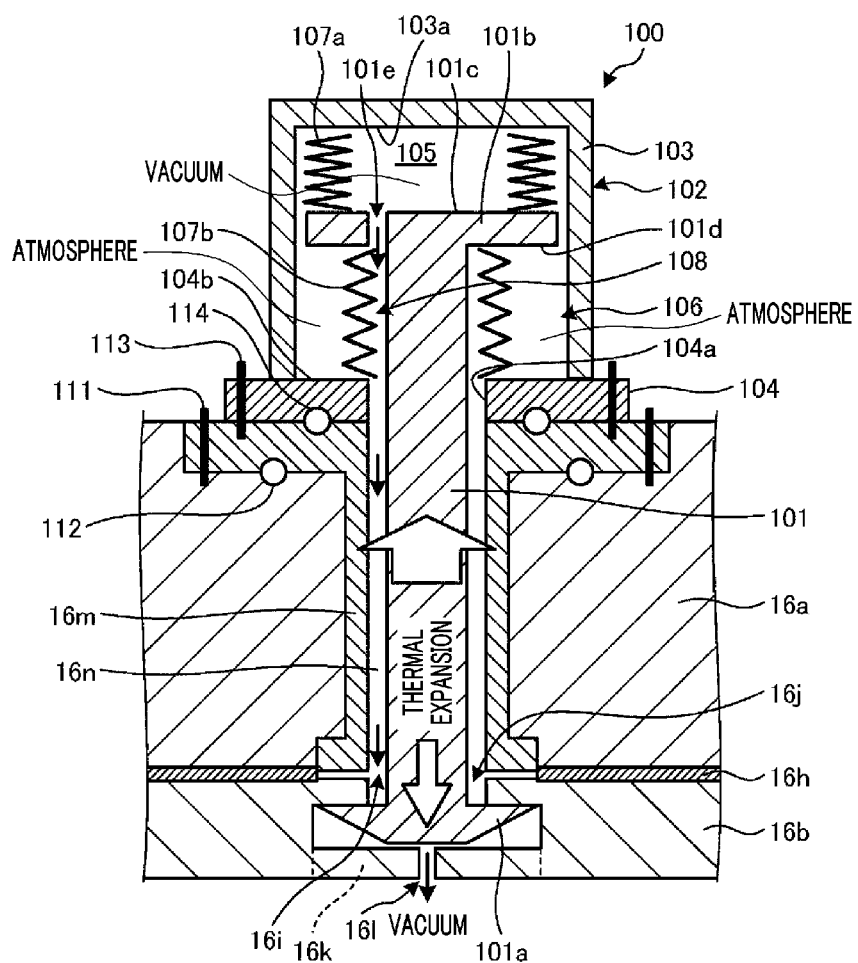
FIG. 5 is a diagram illustrating an operation of the support after the decomposition.

FIG. 5 is a diagram showing an operation of the support 100 after the decompression. If the first space 105 is decompressed, a pressure difference is generated between the first space 105 and the second space 106. Due to this pressure difference, an upward force is applied to the supporting member 101, so that the supporting member 101 is raised. By way of example, before the inside of the chamber 1 is decompressed, an upward force by the atmosphere in the second space 106 and a downward force by the atmosphere in the first space 105 are applied to the end portion 101b of the supporting member 101. If the first space 105 is decompressed as the inside of the chamber 1 is decompressed, the downward force by the atmosphere of the first space 105 is reduced, so the supporting member 101 is moved upwards by the upward force from the atmosphere of the second space 106. As a result, the upper ceiling plate 16b is also raised as the supporting member 101 is moved up, and comes into firm contact with the main body 16a.

As shown in FIG. 2, the substrate processing apparatus 10 according to the exemplary embodiment has the eight supports 100 which are provided to correspond to the periphery of the upper ceiling plate 16b. Accordingly, a peripheral portion of the upper ceiling plate 16b can be brought into uniformly firm contact with the main body 16a. Further, in the substrate processing apparatus 10, the single support 100 is provided to correspond to the center of the upper ceiling plate 16b. Accordingly, a central portion of the upper ceiling plate 16b is allowed to be in firm contact with the main body 16a.

Further, in the substrate processing apparatus 10 according to the exemplary embodiment, the upper ceiling plate 16b is not fixed to the main body 16a. Instead, the upper ceiling plate 16b is supported by the support 100 with the force generated by the pressure difference between the first space 105 and the second space 106. Therefore, even if the supporting member 101 is linearly expanded due to the heat input from the plasma, the supporting member 101 can be slid keeping up with the linear expansion. Thus, the force which supports the upper ceiling plate 16b is hardly changed. Thus, by supporting the upper ceiling plate 16b with the supports 100, the substrate processing apparatus 10 of the exemplary embodiment is capable of suppressing a variation of a contact pressure between the upper ceiling plate 16b and the main body 16a even when the temperature of the supports 100 changes.

Here, if the upper ceiling plate 16b and the main body 16a are coupled by using screws such as bolts instead of using the supports 100, the upper ceiling plate 16b may be broken if it is screwed to the main body 16a with an excessively large torque. Further, since the torques of the individual screws may easily become non-uniform, it is required to manage the torques of the screws. Further, if the bolts are used, the contact pressure between the upper ceiling plate 16b and the main body 16a may be easily changed with a lapse of time due to a difference in linear expansion of the bolts which is caused by the heat input from the plasma.

Meanwhile, the supports 100 according to the exemplary embodiment does not adopt the structure in which the upper ceiling plate 16b and the main body 16a are coupled by the screws such as bolts. Therefore, when the upper ceiling plate 16b is mounted to the main body 16a, it is not required to manage the torques of the screws, and a mounting defect caused by loose screws can be suppressed. Further, a breakage of the upper ceiling plate 16b that may be caused by fixing the upper ceiling plate 16b to the main body 16a with an excessively large torque can also be suppressed. Further, since the supports 100 support the upper ceiling plate 16b with the force generated by the pressure difference between the first space 105 and the second space 106, the variation of the contact pressure between the upper ceiling plate 16b and the main body 16a with a lapse of time can be suppressed.

Further, in the support 100, the first space 105 communicates with the inside of the chamber 1. Accordingly, in the substrate processing apparatus 10, by decompressing the chamber 1, the upper ceiling plate 16b is raised to come into firm contact with the main body 16a, and it is not required to provide a decompressing device for decompressing the first space 105 additionally.

The support 100 is designed such that the contact pressure between the upper ceiling plate 16b and the main body 16a reaches a predetermined pressure when the chamber 1 is decompressed to a vacuum level at the substrate processing is performed.

Figure 6:
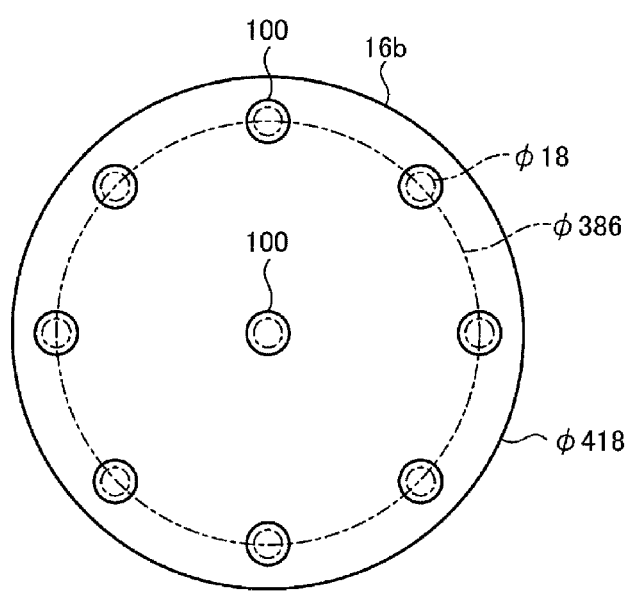
FIG. 6 is a diagram illustrating an example of design values of the substrate processing apparatus according to the exemplary embodiment.

FIG. 6 is a diagram showing an example of design values of the substrate processing apparatus 10 according to the exemplary embodiment. For example, assume the upper ceiling plate 16b has a diameter of 418 mm and a weight of 4.2 kg. It is also assumed that the eight supports 100 provided to correspond to the periphery of the upper ceiling plate 16b are arranged along a circle having a diameter of 386 mm. In each support 100, a region surrounded by the bellows 107a on the top surface of the end portion 101b is a circle having a diameter of 18 mm. The circular region surrounded by the bellows 107a has an area of $0.000254 \text{ m}^2$ ($=(0.009)^2 \times 3.14$). Since there are the nine supports 9, an area in which the pressure difference is generated amounts to $0.00229 \text{ m}^2$ ($=0.000254 \times 9$). The atmospheric pressure is set to be 101325 Pa ($\text{N/m}^2$). In this case, a force by which the nine supports 100 pull the upper ceiling plate 16b in the upward direction becomes 232 N ($=0.00229 \times 101325$).

Meanwhile, the upper ceiling plate 16b has the weight of 4.2 kg. Thus, a downward force by the gravity applied to the upper ceiling plate 16b is 41 N ($=4.2 \times 9.8$).

Accordingly, the contact pressure between the upper ceiling plate 16b and the main body 16a is 191 N ($=232$ N$-41$ N). The substrate processing apparatus 10 according to the exemplary embodiment is capable of varying the contact pressure between the upper ceiling plate 16b and the main body 16a by changing the number of the supports 100 or the area of the region surrounded by the bellows 107a.

As stated above, the substrate processing apparatus 10 according to the exemplary embodiment includes the upper ceiling plate 16b (upper member), the main body 16a (ceiling member), the supporting member 101, the accommodation member 102, and the exhaust device 73 (pressure controller). The upper ceiling plate 16b is disposed in the upper portion within the chamber 1 (processing chamber) in which the substrate processing upon the substrate W is performed. The main body 16a forms the ceiling of the chamber 1, and the through hole 16i is formed in the facing surface of the main body 16a facing the upper ceiling plate 16b. The supporting member 101 is inserted through the through hole 16i and configured to be slidable therein. The supporting member 101 supports the upper ceiling plate 16b with the one end thereof which is located within the chamber 1. The accommodation member 102 accommodates therein the other end of the supporting member 101 located outside the chamber 1, and is partitioned into the first space 105 at the one end side in the moving direction of the supporting member 101 with respect to the other end of the supporting member 101 and the second space 106 at the other end side in the moving direction of the supporting member 101 with respect to the other end thereof. The exhaust device 73 generates, between the first space 105 and the second space 106, the pressure difference which causes the supporting member 101 to be moved. With this configuration, the substrate processing apparatus 10 is capable of suppressing the variation of the contact pressure between the main body 16a and the upper ceiling plate 16b.

Further, in the accommodation member 102, the second space 106 is the atmospheric pressure space, and the bellows 107b (expanding/contracting member) is provided around the supporting member 101 to separate the second space 106 and the third space 108 which is provided around the supporting member 101 while being surrounded by the bellows 107b. The other end of the supporting member 101 has the hole 101e through which the first space 105 and the third space 108 are connected. The first space 105 and the chamber 1 communicate with each other through the hole 101e, the third space 108 and the through hole 16i. By decompressing the chamber 1, the exhaust device 73 generates the pressure difference between the first space 105 and the second space 106, thus allowing the supporting member 101 to be moved. With this configuration, the substrate processing apparatus 10 does not need to have an additional exhaust device for generating the pressure difference between the first space 105 and the second space 106. That is, by decompressing the chamber 1 through the use of the exhaust device 73, the upper ceiling plate 16b and the main body 16a can be maintained in firm contact with each other.

So far, the exemplary embodiment has been described. However, it should be noted that the exemplary embodiment is illustrative in all aspects and is not anyway limiting. In fact, the above-described exemplary embodiment can be embodied in various forms. Further, the above-described exemplary embodiment may be omitted, replaced and modified in various ways without departing from the scope and the spirit of claims.

By way of example, in the above-described exemplary embodiment, a temperature control mechanism such as a heater or a path in which a temperature control fluid such as a coolant flows may be provided in the main body 16a to adjust a temperature of the main body 16a. Further, by using the functional film 16h having the thermal conductivity, the heat exchange may be performed between the upper ceiling plate 16b and the main body 16a to thereby adjust the temperature of the upper ceiling plate 16b.

Figure 7:
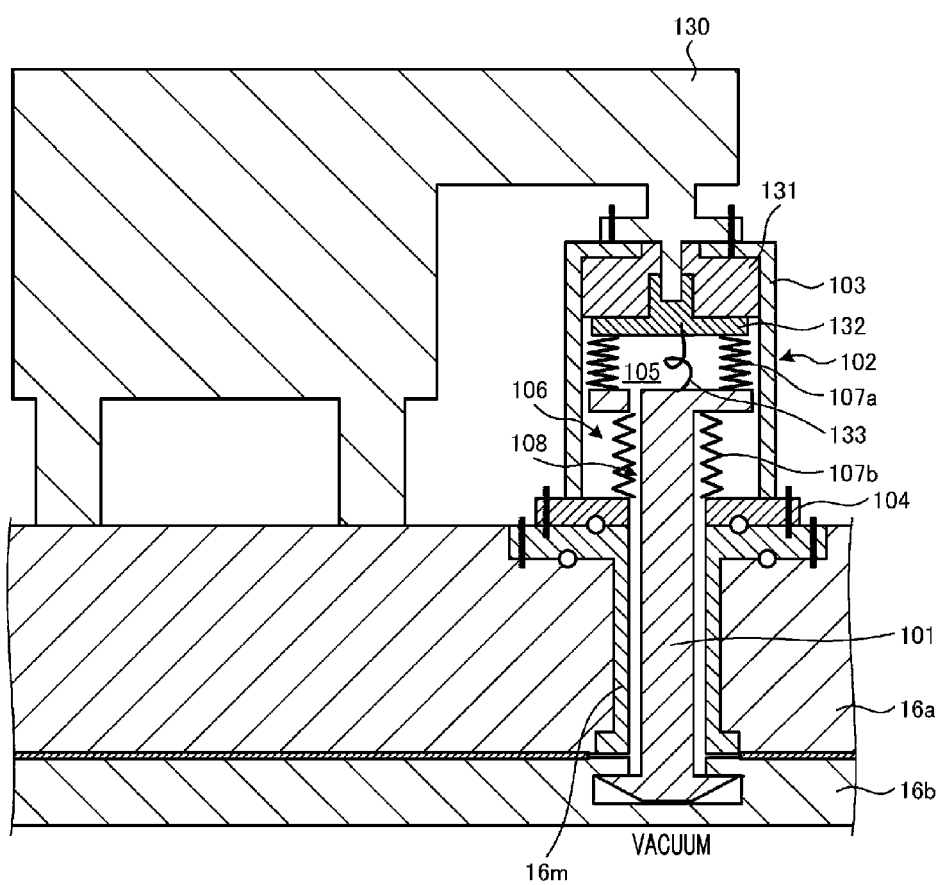
FIG. 7 is a diagram illustrating an example configuration of the substrate processing apparatus in which a voltage can be applied to an upper ceiling plate.

Further, the substrate processing apparatus 10 according to the above-described exemplary embodiment may be configured to be capable of applying a voltage to the upper ceiling plate 16b via the support 100. FIG. 7 is a diagram illustrating an example of a configuration where the substrate processing apparatus 10 according to the exemplary embodiment is capable of applying the voltage to the upper ceiling plate 16b. The main body 16a is formed of a conductive material, and the insulating member 16m is provided on the sidewall of the through hole 16i facing the supporting member 101. A power supply 130 configured to apply a DC voltage is provided at an upper portion of the chamber 1, and connected to the supporting member 101 via conductors 131 and 132 provided at an end surface of the housing 103 and a conductive wire 133. The supporting member 101 is made of a conductive material, and the DC voltage is applied to this supporting member 101. The upper ceiling plate 16b is made of a conductive material, and the DC voltage is applied thereto via the supporting member 101. With this configuration, the substrate processing apparatus 10 is capable of applying the DC voltage to the upper ceiling plate 16b via the support 100.

Further, the above exemplary embodiment has been described for the example where the first space 105 is decompressed by decompressing the chamber 1 with the exhaust device 73 in the state that the first space 105 communicates with the inside of the chamber 1. However, the exemplary embodiment is not limited thereto. By way of example, an exhaust device communicating with the first space 105 of the accommodation member 102 and configured to exhaust the first space 105 may be additionally provided. In this case, the hole 101e need not be formed at the end portion 101b of the supporting member 101.

Further, the substrate processing apparatus 10 according to the above-described exemplary embodiment may be equipped with a detector configured to detect whether the support 100 supports the upper ceiling plate 16b normally. The detector configured to detect a pressure or a capacitance of the first space 105 of the accommodation member 102 may be provided, and a movement of the supporting member 101 is detected from the detected pressure or capacitance of the first space 105. The controller 90 may monitor bending of the upper ceiling plate 16b, an operation, a safety factor of a stroke length of the supporting member 101 by a linear expansion difference, and so forth from the detection result.

Further, in the substrate processing apparatus 10 according to the above-described exemplary embodiment, the inside of the accommodation member 102 is partitioned into the first space 105 and the second space 106 by the bellows 107a. However, the exemplary embodiment is not limited thereto. By way of example, a sealing member such as an O-ring or a seal capable of maintaining airtightness even when the end portion 101b is slid may be provided between a circumferential surface as a side surface of the end portion 101b and an inner side surface of the accommodation member 102, and the inside of the accommodation member 102 may be divided into the first space 105 and the second space 106.

Furthermore, the above exemplary embodiment has been described for the example where the substrate is the semiconductor wafer. However, the exemplary embodiment is not limited thereto. For example, the substrate may be any of various kinds such as a glass substrate.

Further, in the above-described exemplary embodiment, the plasma etching apparatus is described as the substrate processing apparatus 10. However, the exemplary embodiment is not limited thereto. The substrate processing may be any of various other kinds of substrate processings such as a film forming processing and a modifying processing. The substrate processing apparatus is not particularly limited as long as it has a structure in which the ceiling member and the upper member are in contact with each other. By way of example, the present disclosure can be applied to a film forming apparatus or a modifying apparatus using plasma.

Further, in the above-described exemplary embodiment, capacitively coupled plasma (CCP) is used as an example of the plasma source. However, the exemplary embodiment is not limited thereto. By way of non-limiting example, inductively coupled plasma (ICP), microwave-excited surface wave plasma (SWP), electron cyclotron resonance plasma (ECP) or helicon wave excited plasma (HWP) may be used as the plasma source.

So far, the exemplary embodiment has been described. However, it should be noted that the exemplary embodiment is illustrative in all aspects and is not anyway limiting. In fact, the above-described exemplary embodiment can be embodied in various forms. Further, the above-described exemplary embodiment may be omitted, replaced and modified in various ways without departing from the scope and the spirit of claims.

According to the exemplary embodiment, it is possible to suppress a variation of a contact pressure between the ceiling member and the upper member.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus, comprising:
   an upper member disposed at an upper portion within a processing chamber in which a substrate processing upon a substrate is performed;
   a ceiling member, forming a ceiling of the processing chamber, provided with a first through hole at a facing surface thereof which faces the upper member;
   a supporting member configured to support the upper member with a first end thereof which is located inside the processing chamber by being inserted through the first through hole and slid within the first through hole;
   an accommodation member, accommodating therein a second end of the supporting member located outside the processing chamber;

a first expanding/contracting member disposed on an upper side of the second end of the supporting member and configured to separate a first space, which is an inner space surrounded by the first expanding/contracting member, from a second space, which is an outer space of the first expanding/contracting member;

a second expanding/contracting member disposed on a lower side of the second end of the supporting member and configured to separate the second space from a third space which is provided around the supporting member and is surrounded by the second expanding/contracting member; and a pressure controller configured to generate a pressure difference between the first space and the second space, the pressure difference allowing the supporting member to be moved, wherein in the accommodation member, the second space is configured as an atmospheric pressure space, a first hole through which the first space and the third space are connected is formed at the second end of the supporting member, the first space and the processing chamber communicate with each other through the first hole, the third space and the first through hole, and the pressure controller is configured to generate the pressure difference between the first space and the second space by decompressing the processing chamber, the pressure difference allowing the supporting member to be moved.

2. The substrate processing apparatus of claim 1,
wherein the ceiling member is provided with a temperature control mechanism configured to control a temperature thereof, and
either one or both of the ceiling member and the upper member have a sheet having thermal conductivity at a facing surface thereof.

3. The substrate processing apparatus of claim 2,
wherein the sheet has electric conductivity.

4. The substrate processing apparatus of claim 1,
wherein the ceiling member is made of a conductive material, and an insulating member is provided on a facing surface of the first through hole which faces the supporting member, the supporting member is made of a conductive material and a DC voltage is applied to the supporting member, and the upper member is made of a conductive material, and the DC voltage is applied to the upper member via the supporting member.

5. The substrate processing apparatus of claim 1,
wherein the first through hole is provided on the ceiling member in plurality, and
the supporting member and the accommodation member are provided in plurality corresponding to the plurality of first through holes.

6. The substrate processing apparatus of claim 1,
wherein the upper member is made of a silicon-containing material.

7. The substrate processing apparatus of claim 6,
wherein the ceiling member is made of aluminum.

8. The substrate processing apparatus of claim 1,
wherein the supporting member is made of a conductive material, and
an insulating member is provided between a circumferential surface of the first through hole and the supporting member.

9. The substrate processing apparatus of claim 8,
wherein the insulating member is fixed to the ceiling member by a fixing member.

10. The substrate processing apparatus of claim 1,
wherein the upper member is provided with a second through hole,
a lower surface of the upper member corresponding to the second through hole is covered with a cover member, and
the cover member is provided with a second hole.

11. The substrate processing apparatus of claim 1,
wherein the supporting member comprises a shaft portion and a flange portion at the second end, and the flange portion is provided with the first hole.

12. The substrate processing apparatus of claim 11,
wherein the first expanding/contracting member is provided on an upper surface of the flange portion the second expanding/contracting member is provided on a lower surface of the flange portion.

* * * * *